United States Patent [19]

Dixit et al.

[11] Patent Number: 4,960,732
[45] Date of Patent: Oct. 2, 1990

[54] CONTACT PLUG AND INTERCONNECT EMPLOYING A BARRIER LINING AND A BACKFILLED CONDUCTOR MATERIAL

[75] Inventors: Pankaj Dixit, Sunnyvale; Jack Sliwa, Los Altos Hills; Richard K. Klein; Craig S. Sander, both of Mountain View; Mohammad Farnaam, Santa Clara, all of Calif.

[73] Assignee: Advanced Micro Devices, Inc., Sunnyvale, Calif.

[21] Appl. No.: 436,399

[22] Filed: Nov. 14, 1989

Related U.S. Application Data

[62] Division of Ser. No. 16,429, Feb. 19, 1987, Pat. No. 4,884,123.

[51] Int. Cl.$^5$ .................. H01L 21/44; H01L 21/48
[52] U.S. Cl. .................. 437/192; 437/190; 437/194; 437/195; 437/200; 357/71
[58] Field of Search .............. 437/190, 192, 194, 195, 437/200

[56] References Cited

U.S. PATENT DOCUMENTS 4,624,864 11/1986 Hartmann ................ 437/192
4,829,024 5/1989 Klein et al. ................ 437/192

FOREIGN PATENT DOCUMENTS 60-250652 12/1985 Japan ................ 437/192
61-142739 6/1986 Japan ................ 437/192
63-077115 4/1988 Japan ................ 437/190

OTHER PUBLICATIONS

"Contact Resistance Improvement for Tungsten Metallurgy", *IBM Technical Disclosure Bulletin*, vol. 32, No. 8B, Jan. 1990, p. 50.

Primary Examiner—Brian E. Hearn
Assistant Examiner—Laura Holtzman
Attorney, Agent, or Firm—David W. Collins

[57] ABSTRACT

A stable, low resistance contact is formed in a contact hole (16) through an insulating layer (14), e.g., silicon dioxide, formed on a surface of a semiconductor substrate (12), e.g., silicon, to a portion of a doped region (10) in said semiconductor surface. The contact comprises (a) an adhesion and contacting layer (18) of titanium formed along the walls of the insulating layer and in contact with the portion of the doped region; (b) a barrier layer (20) formed over the adhesion and contacting layer; and (c) a conductive material (22) formed over the barrier layer and at least substantially filling said contact hole. A patterned metal layer (26) forms an ohmic contact interconnect to other devices and external circuitry.

The adhesion and contacting layer and barrier layer are either physically or chemically vapor deposited onto the oxide surface. The conductive layer comprises one of CVD or bias sputtered tungsten, molybdenum or in situ doped CVD polysilicon.

The contact of the invention avoids the problems of encroachment at the oxide-silicon interface and worm holes associated with other contact schemes but retains process simplicity.

37 Claims, 3 Drawing Sheets

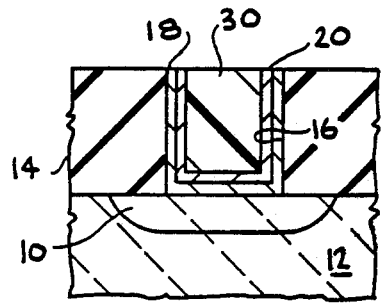
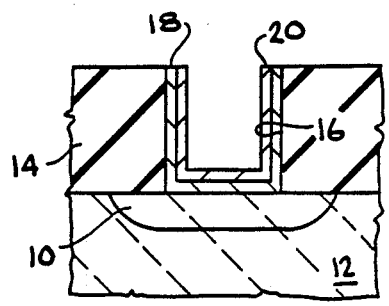
FIG. 3C     FIG. 3D
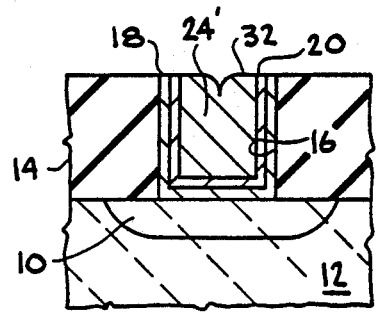
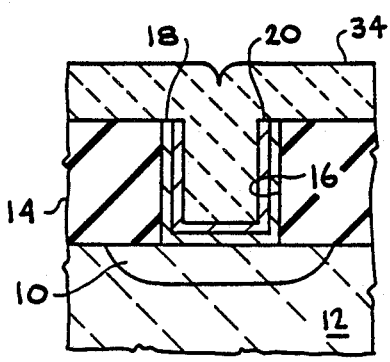
FIG. 3E     FIG. 4A
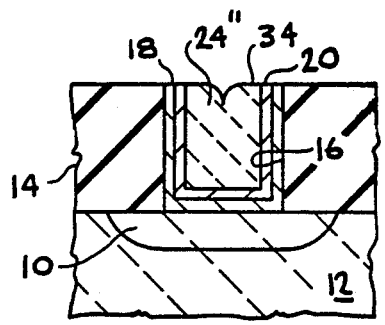
FIG. 4B

CONTACT PLUG AND INTERCONNECT EMPLOYING A BARRIER LINING AND A BACKFILLED CONDUCTOR MATERIAL

This is a division of application Ser. No. 07/016,429, filed Feb. 19, 1987 U.S. Pat. No. 4,884,123.

BACKGROUND OF THE INVENTION

1. Field of the Invention

The present invention relates to fabricating semiconductor devices, and, more particularly, to increasing the step coverage of the interconnect metal by forming a plug in the contact hole. Use of chemical vapor deposition (CVD) in combination with sputtering eliminates the disadvantages associated with either technique alone.

2. Description of the Related Art

During fabrication of semiconductor devices employing multilevel metal interconnections, aluminum (Al) alloys are typically sputtered on wafers and then patterned as interconnects. These interconnect lines make contact with the substrate or another metal layer through a hole in dielectric layers called a "contact hole" or "via".

Normally, the step coverage of metal, which is generally defined as the percentage ratio of the minimum metal thickness at any point in the contact to the metal thickness on top of the dielectric layer, is about 50% or lower for sputtered Al alloys. Certain modifications in the contact shape, such as sloped walls or that obtained by combined wet and dry etching, help improve the step coverage, but such modifications produce larger diameter contacts, resulting in increased contact pitch and requiring broader metal lines to cover the contact area.

In order to obtain tighter geometries, it is desirable to have contacts with unsloped vertical sidewalls. The step coverage of sputtered aluminum on vertical walled cylindrical contacts is unfortunately very poor, and thus the interconnect as a whole is highly unreliable.

To overcome this problem, a plug of a conducting material may be used to fill the contact. One of the ways this could be done is to grow tungsten selectively in the contact area by CVD. There are several problems associated with this method, namely, encroachment at the oxide-silicon interface and worm hole damage to the underlying silicon as described by E. K. Broadbent and W. T. Stacy, "Selective Tungsten Processing by Low Pressure CVD", Solid State Technology, pp. 51–59 (December 1985).

Another process is to deposit blanket tungsten by a CVD process and etch it back in order to leave plugs in the contact holes only. Since tungsten has poor adhesion to silicon dioxide, an adhesion layer of tungsten silicide is employed between the oxide and the tungsten layer. The contact resistance of tungsten silicide to the doped substrate is poor, therefore, a flash tungsten layer is deposited only in the contact area prior to the tungsten silicide layer deposition to improve the contact resistance. The deposition process for flash tungsten is very similar to that of selective tungsten. This flash tungsten has the same problems associated with it as the selective tungsten process, namely, encroachment and worm hole damage.

Another way that a plug can be implemented is to deposit a blanket layer of polysilicon across the wafer (including in the contact holes) and then etch it back flush to the oxide surface, leaving polysilicon plugs in the contact holes. These plugs could then be appropriately doped to make contact to the underlying semiconductor. One of the disadvantages associated with this technique for use in CMOS and bipolar circuits is that in order to contact both N+ and P+ regions, at least one masking step is required to isolate the contacts of one doping polarity from those of the other polarity in order to prevent counterdoping. This masking step represents a significant increase in process complexity. Another disadvantage is That since the dopant is introduced from the top of the plug and must diffuse downward all the way through the plug, it is difficult to achieve a highly uniform dopant distribution in very tall (>15,000 Å) plugs, thereby greatly increasing the resistance of these contacts.

Recent schemes for the implementation of plug processes can be typified by that of Widmann and Sigusch, U.S. Pat. No. 4,562,640, "Method of Manufacturing Low Resistance Contacts in Integrated Semiconductor Circuits". In that reference, the patentees show a plug comprising a blanket-deposited conformal N+ polysilicon in contact with a previously selectively formed silicide. While it is contended that this structure is functional so long as all subsequent processing is carried out below 400° C. (or only using rapid laser annealing above 400° C.), the process had two drawbacks.

The first drawback is that the silicide contacting layer requires several separate steps for its formation. The second drawback is that with this approach, all subsequent processing is limited to below about 400° C. This limits one to the use of low temperature (about 300° to 350° C.) polysilicon deposition, which has inferior conformality as compared to polysilicon deposited by higher temperature (about 600° to 650° C.) processes. The low temperature restriction also limits the degree of dopant activation in the polysilicon layer, resulting in higher contact resistance.

While the patentees attempt to provide a solution to this problem by adding a barrier between the silicide and the poly, the chromium/chromium oxide barrier solution shown is selective in that it is only left in the contact hole. Thus, three steps are required to make the silicide contact, two steps to make the barrier, and two steps to make the polysilicon cap. In addition to this process complexity, the polysilicon dopants will diffuse through the chromium/chromium oxide barrier even at 450°C.

Thus, there remains a need for a contact plug which avoids most, if not all, the foregoing problems.

SUMMARY OF THE INVENTION

Accordingly, it is an object of the present invention to provide a contact plug in the contact area that does not evidence the problems associated with flash tungsten or selective tungsten deposition.

It is another object of the present invention to be able to use the plug material as an integral part of the interconnect.

It is yet another object of the present invention to use an additional layer to reduce the line electromigration susceptibility of the aluminum interconnect.

In accordance with the invention, a stable, low resistance contact is formed in a contact hole etched through an insulating layer, formed on a surface of a semiconductor substrate, to a portion of a doped region in said semiconductor surface. The contact comprises (a) an adhesion and contacting layer of titanium formed along the walls of the insulating layer and in contact with the portion of the doped region; (b) a barrier layer formed over the adhesion and contacting layer; and (c) a conductive material formed over the barrier layer and at least substantially filling said contact hole. A subsequently deposited and patterned metal layer forms an interconnect to other devices and external circuitry.

In the process of the invention, the adhesion and contacting layer and the barrier layer are deposited onto the oxide surface and into the contact hole. Several embodiments are disclosed for forming the plug of conductive material, which comprises CVD or bias sputtered tungsten or molybdenum or in situ doped CVD polysilicon.

The contact of the invention avoids the problems of loss of selectivity, encroachment at the oxide-silicon interface, and worm holes associated with other contact schemes. Further, the contact permits later processes to take place at temperatures higher than those permitted by the prior art (higher than 400° C.) without concern for the movement of silicon or dopant across the contact interface.

Other objects, features and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

FIGS. 3a–e are cross-sectional views of the sequence of processing steps of yet another embodiment of the invention; and FIGS. 4a–b are cross-sectional views of a portion of the sequence of processing steps of still another embodiment of the invention.

DETAILED DESCRIPTION OF THE INVENTION

Figure 1A:
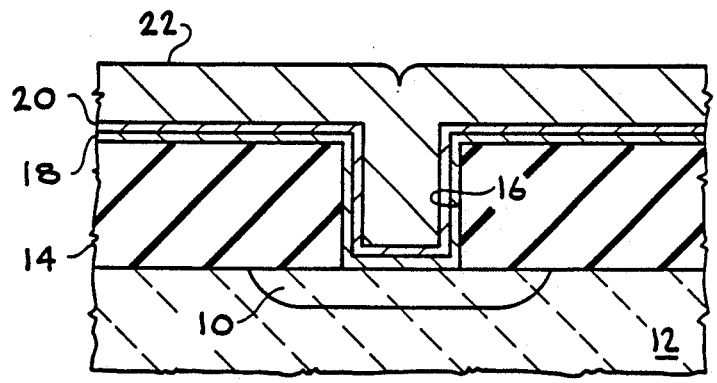
FIGS. 1a–d are cross-sectional views of the sequence of processing steps for providing the contact plug of the invention.

Reference is now made in detail to a specific embodiment of the present invention, which illustrates the best mode presently contemplated by the inventors for practicing the invention. Alternative embodiments are also briefly described as applicable.

In the fabrication of semiconductor integrated circuits, doped regions 10 are formed in a major surface of a semiconductor substrate 12 (the wafer) or in an epitaxial layer (not shown) formed thereon. Oxide regions (not shown) may be formed to isolate one device from another.

Once the devices have been defined by the various steps of masking, etching, doping, oxide formation, etc., it is necessary to form metal interconnects to interconnect the devices with each other and provide a conductive path to external circuitry. Typically, such interconnect formation is preceded by formation of a dielectric material 14 which covers field oxide and all underlying conductive regions such as polysilicon and source/drain regions in order to prevent shorts to the first metal layer. This is referred to as the first interlayer dielectric, which isolates the first metal from underlying polysilicon interconnects. For silicon-based devices, this dielectric material usually comprises silicon dioxide, possibly doped with phosphorus, boron/phosphorus or arsenic, formed by conventional processes to the typical thickness employed in this technology.

Contact holes 16 (i.e., vias) are patterned and etched down to the doped regions and polysilicon gates. Conductive material, typically aluminum, is deposited everywhere, including in the contact holes. The aluminum film is then patterned in such a manner that the appropriate contacts are connected by individual metal traces.

The invention is implemented at the point in the process where the first interlayer dielectric 14 has been deposited and the vertical walled contact holes 16 have been patterned and etched down to the substrate 12 and any polysilicon layers formed thereon (not shown).

In accordance with the invention, a thin layer 18 of titanium is formed in the contact hole 16 to ensure good adhesion and good electrical contact of subsequent layers to underlying doped regions and/or polysilicon. Next, a somewhat thicker layer 20, comprising a barrier material, is formed over the adhesion and contacting layer 18. Finally, a conductive material 22 is deposited conformally to fill the contact hole.

The layer 18 of titanium is on the order of about 100 to 800 Å thick. A thickness of less than about 100 Å will not guarantee adequate coverage at the bottom of the contact holes, while a thickness greater than about 800 Å may consume unacceptable amounts of silicon from the junctions due to titanium silicide formation, which could lead to increased junction leakage current. The layer 18 is conveniently deposited by sputtering from a titanium target in an argon ambient, as is typically the case.

The barrier layer 20 comprises a conductive material which is a diffusion barrier to the typical dopant species (boron and phosphorus) commonly employed in doping silicon. The barrier layer 20 is also a barrier to silicon diffusion.

Examples of suitable barrier materials include certain refractory metals as well as their nitrides, borides, carbides and oxides, specifically, tungsten, molybdenum, titanium-tungsten, titanium nitride, titanium tungsten nitride, tungsten nitride, molybdenum nitride, etc, as well as chromium, chromium-chromium oxide and boron nitride. Preferably, the barrier material comprises titanium nitride, titanium-tungsten, titanium tungsten nitride or boron nitride, due to their superior barrier properties. Since TiN is a proven diffusion barrier for dopant species as well as for silicon diffusion, it is the most preferred material in the practice of the invention.

The barrier layer 20 is preferably formed to a thickness of about 250 to 2,000 Å, and is conveniently formed by reactive sputtering, CVD or reactive annealing. Sputter deposition of TiN is accomplished by sputtering Ti in an argon/nitrogen ambient. TiN can also be formed by titanium deposition followed by reactive annealing in a nitrogen ambient. It is difficult to form a pinhole-free barrier with thicknesses less than about 250 Å and employing thicknesses greater than about 2,000 Å provides little additional protection.

CVD technology for the deposition of Ti/TiN is now emerging and will provide a method to extend the application of this invention to very deep and narrow vias. As used herein, CVD processes also include low pressure CVD (LPCVD) and plasma-enhanced CVD (PECVD).

After deposition of the barrier layer 20, an optional layer 21 of $WSi_x$ or silicon may be deposited by CVD in the manner typical for CVD tungsten. A portion of such a layer 21 is depicted in FIG. 1c (dotted lines). It is noted that layer 21 is not required for deposition on TiN.

Layer 22 comprises a conductive material capable of conformal deposition. Preferred examples of such materials include CVD or bias sputtered tungsten or molybdenum or in situ-doped CVD polysilicon. The resulting structure is depicted in FIG. 1a.

Figure 1B:
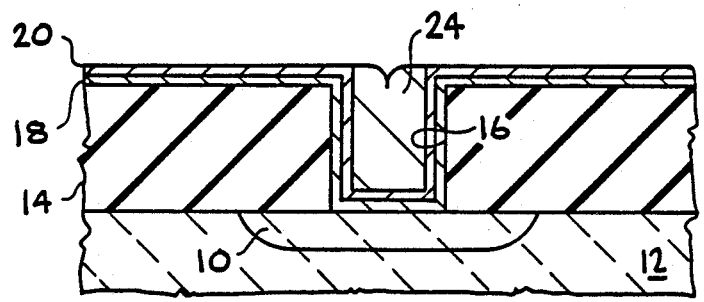
Figure 1C:
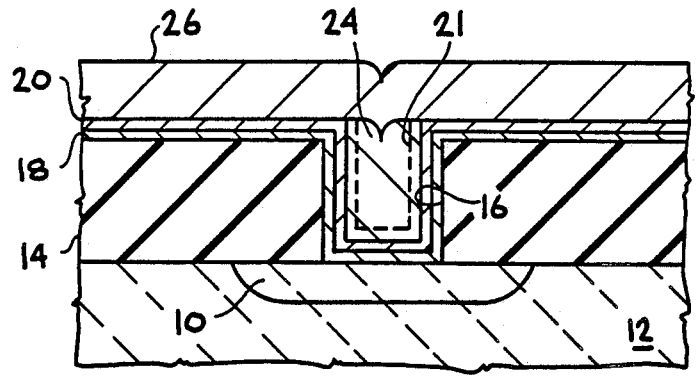

This conductive layer 22 is then etched back from the unpatterned area surrounding the contact holes 16, called the field area, so that there is no material left on the field area, but the contacts are filled, forming plugs 24, as shown in FIG. 1b. The etch chemistry can be selected in such a way that the sputtered barrier layer 20 is not removed in the etch back process, for example, by using fluorine chemistry in a batch dry etcher.

Figure 1D:
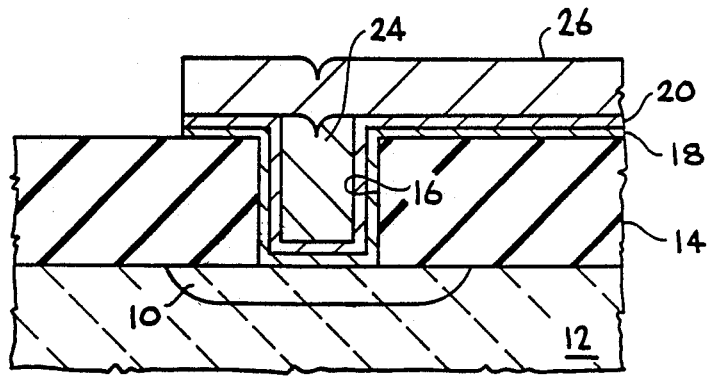

A layer 26 of A1 alloy, typically containing 1% silicon and/or some electromigration-inhibiting component, such as copper or titanium, is then sputter-deposited on the wafer to a thickness of about 2,000 to 10,000 Å thick, as depicted in FIG. 1c. This layer 26 is then patterned and etched in such a way that adhesion and contacting layer 18 and barrier layer 20 are left only under the patterned A1 lines 26 and are removed from the remaining area, as shown in FIG. 1d.

The advantage of this invention is that during deposition, in the case of a CVD tungsten plug process, the gaseous CVD tungsten species responsible for encroachment and worm hole generation never come in direct contact with underlying silicon due to the presence of layers 18 and 20, thereby preventing any such damage. This is a key technological advantage of this invention.

Another advantage of the present invention in the case of an in situ-doped poly plug process is that N+-doped poly can be used as the plug material 24 for both N+ and P+ contacts in CMOS and bipolar circuits because of the presence of the barrier layer 20, which will prevent counter-doping between the N+ poly 24 and the P+ layer 10. This is a significant process simplification.

Yet another advantage provided by the present invention is that since the barrier layer 20 is being used as part of the interconnect layer, the barrier layer will provide a path for conduction in case of electromigration voiding failure either in the plug 24 or in the interconnect line 26, thereby increasing reliability.

Figure 2:
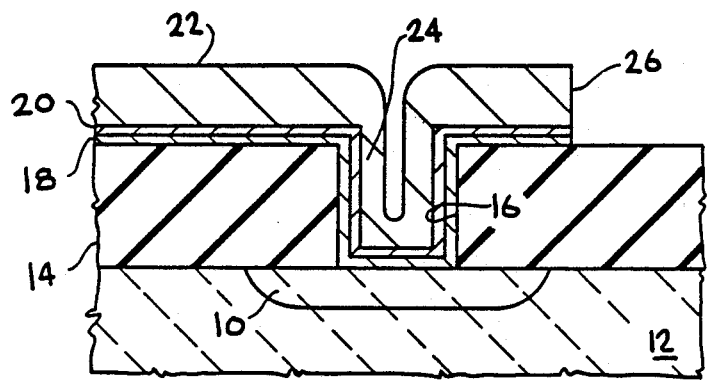
FIG. 2 is a cross-sectional view of an alternate embodiment of the invention.

Since the resistivity of tungsten is low enough that it could be used as an interconnect, one could pattern the as-deposited tungsten layer 22 (FIGS. 1a and 2) to form the interconnect 26 and not employ aluminum at all or, alternatively, use a thin aluminum coating on top of the tungsten (not shown).

Figure 3A:
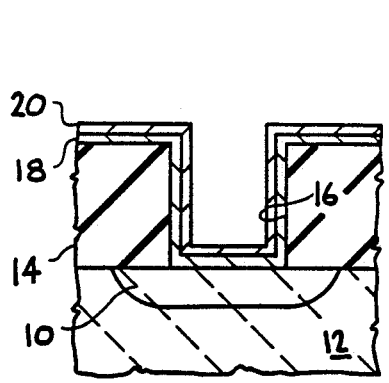
Figure 3B:
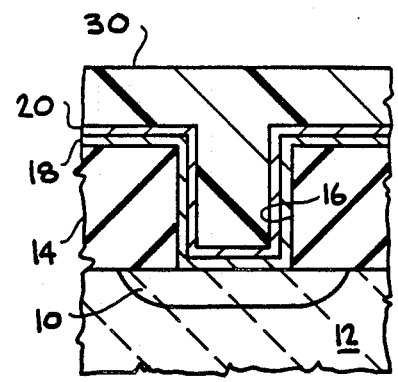

Another way of forming a contact plug is to grow a tungsten layer selectively in the contact hole on a barrier layer using a selective CVD process. Again, the layer 18 and the layer 20 are formed in a contact hole as above, shown in FIG. 3a. In this embodiment, however, resist 30 is spun on the wafer, as shown in FIG. 3b. The resist 30 is then etched back using a dry etch that has a 1:1 selectivity between the resist 30 and the layers 18, 20 to remove both the resist 30 and the layers 18, 20 from the surrounding area. The resist 30 and the underlying layers 18, 20 will remain only in the contact holes 16, as seen in FIG. 3c.

Next, the resist 30 is stripped from the contact holes, thereby leaving layers 18, 20 only in the contact hole 16, as depicted in FIG. 3d. Subsequently, a selective plug-shaped deposit 32 of tungsten is formed by CVD reaction of $WF_6 + H_2$ in the holes. Tungsten will nucleate only on the metal/barrier layer 20 and not on the first layer dielectric 14, thus filling the contact hole 16 to form plug 24'. The structure is shown in FIG. 3e. The patterned interconnect 26 (not shown in FIG. 3e) possibly consisting primarily of an aluminum alloy may then be formed, as above.

The advantage of this process over the conventional selective tungsten process is that tungsten deposition reaction does not occur in a direct contact with the underlying silicon 10, since it is shielded by the barrier layer 20. Thus, the common problems like encroachment and worm holes will not occur since the junction 10 is protected by the barrier layer 20. Another advantage is that the selective tungsten need only be deposited to a thickness slightly greater than half of the contact hole diameter, since the tungsten is growing from all available surfaces rather than from just the contact bottom surface. In this manner, less tungsten deposition time is required than for the industry standard selective tungsten process (in which tungsten grows only upwards) and selectivity is more easily maintained, since selectivity degrades with deposition thickness.

Still another variation of forming an in situ-doped poly plug 24" employing adhesion and contacting/barrier layers 18, 20 is to leave the Ti/TiN only in the contact area by employing the etch-back and resist stripping process as shown in FIGS. 3a–d above. Next, in situ-doped poly 34 is deposited to obtain the structure shown in FIG. 4a. The doped poly layer 34 is then blanket etched, as shown in FIG. 4b. The advantage of this process is that the poly etch back can be controlled better, since it is much easier to detect the end-point of the etch on oxide surfaces than on a typical barrier layer 20, such as TiN. Alternatively, tungsten could be blanket deposited and then blanket etched from the structure shown in FIG. 4b.

Contact plugs employing N+ in situ doped poly and Ti/TiN layers have been fabricated as shown in FIG. 1d. The plug's specific contact resistance to a P+ substrate has been measured. The mean value was found to be $1.0 \times 10^{-6}$ $\Omega-cm^2$ with a 3-sigma deviation of $0.1 \times 10^{-6}$ $\Omega-cm^2$ for contact sizes of 1.0, 1.2 and 1.4 $\mu m$ diameter. Over 500 data points on six wafers were taken for each contact size. These values are considered acceptable for each contact size.

It will be appreciated that the inventive approach herein avoids or improves on the shortcomings of the prior art, as exemplified by Widmann et al, discussed earlier. For example, a separate three-step silicidation process is eliminated by using a sputter-deposited titanium/titanium nitride bilayer which gives excellent contact properties as well as superior performance. Further, this Ti/TiN film is formed not only on the bottom of the via but also on the sidewalls. The Ti/TiN film will withstand 600° C. processing, so that if in situ doped polysilicon is used to fill the contact hole, there is no possibility of dopant getting into or out of the junction.

By bringing the Ti/TiN up the sidewalls, the interfacial area between the plug filling material (i.e., polysilicon or tungsten) and the contacting material (e.g., Ti/TiN) is increased. Thus, in comparison to the prior art of Widmann et al, the contact area between the siliciding layer and the TiN barrier is greatly spread out, as is the contact area between the TiN barrier and the poly or tungsten fill material. Thus, this structure is not only simpler to make, but is also inherently more reliable and does not place a 400° C. limit on further thermal processing. It is to be noted that in the Ti/TiN process, one substantially obtains $TiSi_x$ contact silicidation where titanium contacts the junction.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in numerous IC fabrication technologies such as silicon MOS and CMOS and bipolar processes or gallium arsenide or other III–V processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A process for fabricating stable, low resistance contacts in an integrated semiconductor circuit which comprises:
   (a) providing doped regions in a semiconductor substrate;
   (b) forming at least one insulating layer over said doped regions in the surrounding substrate;
   (c) forming contact holes of substantially uniform size through said at least one insulating layer in selected areas of said doped regions, said holes defined by walls of said insulating layer;
   (d) forming an adhesion and contacting layer of titanium at least in said holes, including along said walls, in contact with the underlying doped region, said adhesion and contacting layer formed to a thickness insufficient to fill said contact holes;
   (e) forming a barrier layer in contact with said adhesion and contacting layer, said barrier layer formed to a thickness insufficient to fill said contact holes; and
   (f) forming a contact plug comprising a conductive material which substantially fills said contact holes and which is in contact with said barrier layer.

2. The process of claim 1 wherein said titanium adhesion and contacting layer is deposited by sputtering from a titanium target.

3. The process of claim 1 wherein said titanium adhesion and contacting layer is deposited to a thickness of about 100 to 800

4. The process of claim 1 wherein said barrier layer is deposited by sputtering, CVD or reactive annealing.

5. The process of claim 1 wherein said barrier layer comprises a material selected from the group consisting of tungsten, molybdenum, titanium-tungsten, titanium nitride, titanium tungsten nitride, tungsten nitride, molybdenum nitride, chromium, chromium-chromium oxide, and boron nitride.

6. The process of claim 5 wherein said barrier layer comprises a material selected from the group consisting of titanium nitride, titanium-tungsten, titanium tungsten nitride, and boron nitride.

7. The process of claim 6 wherein said barrier layer consists essentially of titanium nitride.

8. The process of claim 1 wherein said barrier layer is deposited to a thickness of about 250 to 2,000 Å.

9. The process of claim 1 wherein said conductive material is selected from the group consisting of tungsten, molybdenum and doped polysilicon.

10. The process of claim 1 wherein said adhesion and contacting layer, said barrier layer and said conductive material are blanket deposited on said insulating layer, including in said contact holes.

11. The process of claim 10 wherein
   (a) said conductive material is etched back to expose said barrier layer on said insulating layer but leaving said conductive layer substantially filling said contact hole, thereby preserving said contact plug;
   (b) a metal layer is formed on said exposed barrier layer and in electrical contact with said contact plug; and
   (c) said metal layer and said underlying barrier layer and adhesion and contacting layer are patterned and etched to expose portions of said insulating layer, leaving defined patterns of said metal layer forming interconnect regions.

12. The process of claim 11 wherein said metal layer comprises aluminum or an alloy thereof.

13. The process of claim 10 wherein said conductive material comprises tungsten and wherein said conductive material and said underlying barrier layer and adhesion and contacting layer are patterned and etched to expose portions of said insulating layer, leaving defined patterns of said conductive material and said barrier layer and said adhesion and contacting layer forming interconnect regions, with said interconnect regions at least partially overlying said contact holes.

14. The process of claim 1 wherein (a) said adhesion and contacting layer and said barrier layer are blanket deposited on said insulating layer and in said contact holes, (b) a resist layer is blanket deposited on said barrier layer and in said contact holes sufficient to fill said contact holes substantially completely, (c) said resist and said barrier layer and adhesion and contacting layer are blanket etched to expose said insulating layer, leaving a plug of resist in said contact holes and thereby preserving said adhesion and contacting layer and said barrier layer along the surface of said doped region and at least portions of said walls of said contact holes, and (d) removing said plug of resist from said contact holes.

15. The process of claim 14 wherein tungsten is selectively deposited in said contact holes only to form said contact plug of conductive material.

16. The process of claim 14 wherein a conductive material selected from the group consisting of doped polysilicon and tungsten is blanket deposited sufficient to fill said contact holes substantially completely, and then blanket etched to leave said contact plug of conductive material contained within said contact walls and substantially filling said contact hole.

17. A process for fabricating stable, low resistance contacts in an integrated semiconductor circuit which comprises:
   (a) providing doped regions in a silicon substrate;

(b) forming an insulating layer of silicon dioxide over said doped regions in the surrounding substrate;

(c) forming contact holes through said silicon dioxide of substantially uniform size in selected areas of said doped regions to expose portions thereof, with said contact holes defined by walls of said insulating layer;

(d) sputtering an adhesion and contacting layer of titanium at least in said holes, including along said walls, in contact with the underlying doped region, said adhesion and contacting layer formed to a thickness insufficient to fill said contact holes;

(e) forming a barrier layer comprising a material selected from the group consisting of titanium nitride, titanium-tungsten, titanium tungsten nitride, and boron nitride in said contact holes in contact with said adhesion and contacting layer, said barrier layer formed to a thickness insufficient to fill said contact holes; and (f) forming a contact plug comprising a conductive material which substantially fills said contact holes and which is in contact with said barrier layer, said contact plug formed by depositing by CVD a conductive material selected from the group consisting of tungsten and doped polysilicon.

18. The process of claim 17 wherein said titanium adhesion and contacting layer is deposited to a thickness of about 100 to 800 Å.

19. The process of claim 17 wherein said barrier layer consists essentially of titanium nitride, formed by sputtering titanium in an ambient containing nitrogen.

20. The process of claim 17 wherein said barrier layer is formed by sputtering, CVD or reactive annealing.

21. The process of claim 17 wherein said barrier layer is deposited to a thickness of about 250 to 2,000 Å

22. The process of claim 17 wherein said adhesion layer, said barrier layer and said conductive material are blanket deposited on said layer of silicon dioxide, including in said contact holes.

23. The process of claim 22 wherein
(a) said conductive material is etched back to expose said barrier layer coating on said insulating layer but leaving said conductive layer, substantially filling said contact hole, thereby preserving said contact plug;
(b) a metal layer is formed on said exposed barrier layer and in electrical contact with said contact plug; and
(c) said metal layer and said underlying barrier layer and adhesion and contacting layer are patterned and etched to expose portions of said insulating layer, leaving defined patterns of said metal layer forming interconnect regions.

24. The process of claim 23 wherein said metal layer comprises aluminum or an alloy thereof, sputter-deposited to a thickness of about 2,000 to 10,000 Å.

25. The process of claim 22 wherein said conductive material comprises tungsten and wherein said conductive material and said underlying barrier layer and adhesion and contacting layer are patterned and etched to expose portions of said insulating layer, leaving defined patterns of said conductive material and said barrier layer and said adhesion and contacting layer forming interconnect regions, with said interconnect regions at least partially overlying said contact holes.

26. The process of claim 17 wherein (a) said adhesion and contacting layer and said barrier layer are blanket deposited on said insulating layer and in said contact holes, (b) a resist layer is blanket deposited on said barrier layer and in said contact holes sufficient to fill said contact holes substantially completely, (c) said resist and said barrier layer and adhesion and contacting layer are blanket etched to expose said insulating layer, leaving a plug of resist in said contact holes and thereby preserving said adhesion and contacting layer and said barrier layer along the surface of said doped region and at least portions of said walls of said contact holes, and (d) removing said plug of resist from said contact holes.

27. The process of claim 26 wherein tungsten is selectively CVD deposited only in said contact holes to form said contact plug of conductive material.

28. The process of claim 27 wherein said tungsten plug is formed selectively by CVD reaction of $WF_6$ and $H_2$.

29. The process of claim 26 wherein a conductive material selected from the group consisting of doped polysilicon and tungsten is blanket deposited sufficient to fill said contact holes substantially completely, and then blanket etched to leave said contact plug of conductive material contained within said contact walls and substantially filling said contact hole.

30. The process of claim 29 wherein said doped polysilicon comprises *in situ*-doped polysilicon.

31. A process for fabricating stable, low resistance contacts in an integrated semiconductor circuit which comprises:
(a) providing doped regions in a silicon substrate;
(b) forming an insulating layer of silicon dioxide over said doped regions in the surrounding substrate;
(c) forming contact holes through said silicon dioxide of substantially uniform size in selected areas of said doped regions to expose portions thereof, with said contact holes defined by walls of said insulating layer;
(d) blanket sputtering an adhesion and contacting layer of titanium over said silicon dioxide and into said contact holes in contact with the underlying said doped region, said adhesion and contacting layer formed to a thickness ranging from about 100 to 800 Å;
(e) blanket sputtering a barrier layer consisting essentially of titanium nitride in contact with said adhesion and contacting layer, said barrier layer formed to a thickness ranging from about 250 to 2,000 Å; and
(f) forming a contact plug comprising a conductive material which substantially fills said contact holes and which is in contact with said barrier layer, said conductive material selected from the group consisting of tungsten and in situ doped polysilicon.

32. The process of claim 31 wherein
(a) said conductive material is etched back to expose said barrier layer on said insulating layer but leaving said conductive material substantially filling said contact hole, thereby preserving said contact plug;
(b) a metal layer is formed on said exposed barrier layer and in electrical contact with said contact plug; and
(c) said metal layer and said underlying barrier layer and adhesion and contacting layer are patterned and etched to expose portions of said insulating layer, leaving defined patterns of said metal layer forming interconnect regions.

33. The process of claim 32 wherein said metal layer comprises aluminum or an alloy thereof.

34. The process of claim 31 wherein said conductive material comprises tungsten and wherein said conductive material and said underlying barrier layer and adhesion and contacting layer are patterned and etched to expose portions of said insulating layer, leaving defined patterns of said conductive material and said barrier layer and said adhesion and contacting layer forming interconnect regions, with said interconnect regions at least partially overlying said contact holes.

35. A process for fabricating stable, low resistance contacts in an integrated semiconductor circuit which comprises:
  (a) providing doped regions in a silicon substrate;
  (b) forming an insulating layer of silicon dioxide over said doped regions and the surrounding said silicon substrate;
  (c) forming contact holes through said silicon dioxide of substantially uniform size in selected areas of said doped regions to expose portions thereof, with said contact holes defined by walls of said insulating layer;
  (d) blanket sputtering an adhesion and contacting layer of titanium over said oxide and into said holes in contact with the underlying doped region, said adhesion and contacting layer formed to a thickness ranging from about 100 to 800 Å;
  (e) blanket sputtering a barrier layer consisting essentially of titanium nitride in contact with said adhesion and contacting layer, said barrier layer formed to a thickness ranging from about 250 to 2000 Å;
  (f) blanket depositing a resist layer on said barrier layer, including in said contact holes sufficient to fill said contact holes substantially completely;
  (g) blanket etching said resist layer, said barrier layer and said adhesion and contacting layer to expose said insulating layer, leaving a plug of resist in said contact holes and thereby preserving said adhesion and contacting layer and said barrier layer along the surface of said doped region and at least portions of said walls of said contact holes;
  (h) removing said resist plug; and
  (i) forming a contact plug comprising a conductive material selected from the group consisting of tungsten and doped polysilicon which substantially fills said contact holes and which is in contact with said barrier layer.

36. The process of claim 35 wherein said resist plug is removed and tungsten is selectively deposited in said contact holes only to form said contact plug of conductive material.

37. The process of claim 35 wherein said resist plug is removed and said conductive material is blanket deposited sufficient to fill said contact holes substantially completely, and then blanket etched to leave said contact plug of conductive material contained within said contact walls and substantially filling said contact hole.

* * * * *